June 21, 1960 H. T. GOLDSTEIN ET AL 2,942,108

FINE TUNING MECHANISM FOR TELEVISION RECEIVERS

Filed May 2, 1958

INVENTORS
HARRY T. GOLDSTEIN
ROBERT P. HEINIS
BY
Darby & Darby
ATTORNEYS

United States Patent Office 2,942,108

Patented June 21, 1960

2,942,108

FINE TUNING MECHANISM FOR TELEVISION RECEIVERS

Harry T. Goldstein, Teaneck, and Robert P. Heinis, Totowa Boro, N.J., assignors to Allen B. Du Mont Laboratories, Inc., Clifton, N.J., a corporation of Delaware Filed May 2, 1958, Ser. No. 732,594

3 Claims. (Cl. 250—40)

The present invention relates to television tuning apparatus, and particularly to a mechanism to be used with a well known wafer type of turret tuner to effect a fine tuning operation.

In the past it has been customary to provide a fine tuning mechanism which is common to all of the television channels being associated with a particular channel when the tuner is rotated into the position associated with that channel. Unfortunately, this requires the fine tuning adjustment to be readjusted each time the channel is changed. In the present device the fine tuning is effected by adjusting the oscillator coil through a limited range of inductance value to thereby alter the frequency to which the circuit is tuned by a small amount. This adjustment remains fixed and does not have to be readjusted when the channel is changed.

In the embodiment shown, this variation of the oscillator inductance is effected through the use of a tuning slug in a common manner, but instead of arranging the device so that this adjustment can be made only after removing the chassis from its cabinet it is arranged so that the adjustment can be made by the viewer through the use of a knob protruding from the face of the cabinet.

It is therefore an object of the invention to provide a simple mechanism whereby the user of the television receiver may effect fine tuning of the various channels individually.

It is another object of the invention to provide such a mechanism which will require infrequent operation since variation of the tuning of one channel will have no effect on the tuning of any other channel.

It is a further object of the invention to provide such a tuning mechanism which makes it possible to easily adjust the position of a tuning slug located within an oscillator coil in the usual manner to bring about the fine tuning heretofore mentioned.

Figure 1:
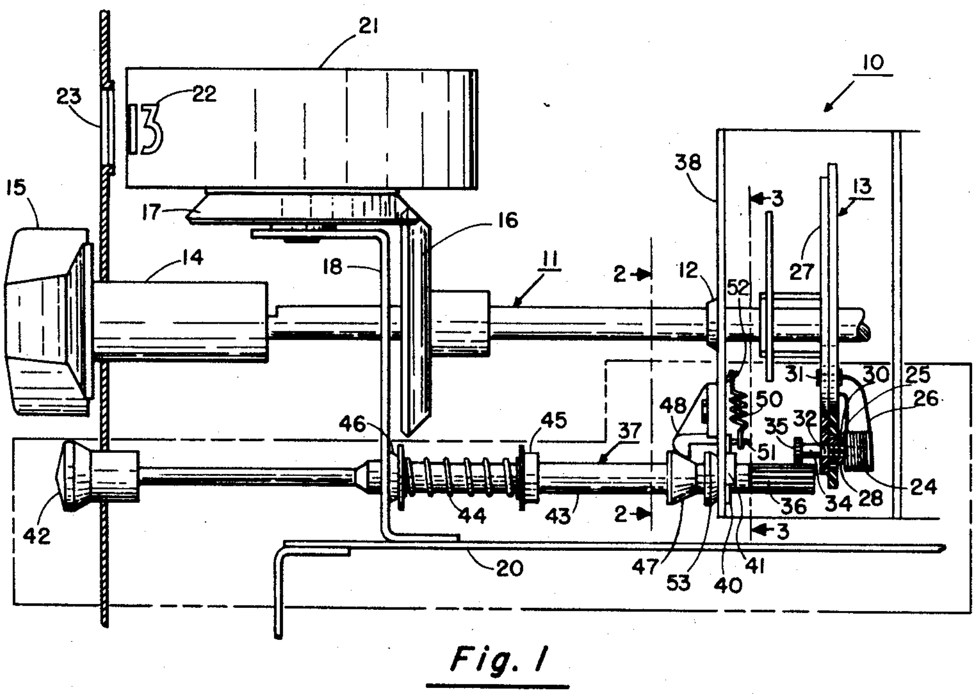
Figure 2:
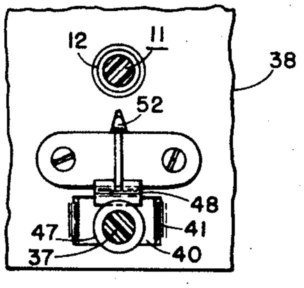
Figure 3:
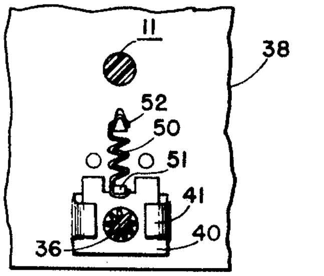

These and other objects will become apparent from a study of the following specifications and drawings, of which, Fig. 1 is a side elevational view of the tuning mechanism of our invention, the tuning wafer being broken away in order to show the mode of mounting the oscillator coil and the slug therein;

Fig. 2 is a sectional view taken on the plane of the line 2—2 showing particularly the operating cam and the mounting of the tuner shafts; and Fig. 3 is a sectional view taken on the plane of the line 3—3 showing particularly the mode of mounting the bearing for the fine tuning shaft.

Referring now to the drawings, and particularly to Fig. 1, there is shown therein at 10 the usual television switch type tuner which comprises a shaft 11 supported in the usual manner by bearings 12 and carrying a plurality of wafers 13, of which only one is shown in the present instance.

Shaft 11 extends forwardly in the usual manner and has the shank 14 of a tuning knob 15 placed thereon for causing rotary movement thereof.

In accordance with the usual practice, a means is provided for indicating the positions of the tuner at any given moment. In the present instance this means comprises a bevel gear 16 fixedly mounted on the shaft 11 meshing with a similar bevel gear 17 rotatably supported on the bracket 18 which is in turn supported from the chassis 20. Fixed to the bevel gear 17 is an indicator drum 21 bearing channel designations thereon, as indicated at 22, the designations being visible in the front of the cabinet through opening 23 supplied therein.

Referring to Fig. 1, the oscillator coils 24, only one of which is shown, are mounted on the wafer 13 in the usual manner, that is, the coil is formed of a relatively heavy conductor and is supported on leads 25 and 26 which are in turn fixed to contacts mounted on the wafers 13 in the usual manner. In accordance with our invention, a nylon ring 27 is provided with bosses 28, which bosses extend through apertures 30 in the wafer 13. The ring 27 is fixed to the wafer 13 in any suitable manner, as for example by means of eyelets 31. The bosses 28 are split and into each boss there is inserted a screw 32 which cuts its own thread as it is inserted, thus insuring a good fit in the associated boss 28. These screws 32 serve as the tuning slugs for the oscillator coils in the usual manner and they may be made of any suitable material such as brass. Each screw is provided with a head 34 formed integrally therewith and having a portion thereof which is formed as a small pinion 35.

Normally, the main tuning shaft 11 and the wafers 13 fixed thereto may be rotated without in any way affecting the adjustment of the tuning screws or slugs 32. However, in accordance with our invention, means are provided for engaging teeth 36 cut on a nylon rod 37 with the pinion 35 in order to adjust the fine tuning of the oscillator coil.

The nylon shaft or rod 37 is supported by bushings in the bracket 18 and in the front plate 38 of the main turret tuner 10. The bushings in the bracket 18 may comprise simply an aperture therein which the shaft 37 fits. The rear bearing or bushing for the shaft 37 is capable of limited movement upwardly from its normal position shown in Fig. 1. The means which provides this limited movement comprises an aperture in the front plate 38 over which a slide member 40 is mounted, this member being held in position by means of ears 41 bent off from the plate 38 and extending over both side edges of the slider 40.

In the particular instance, the bearing surface is formed in the slider 40 by punching a hole therein of the proper diameter and drawing the metal to form an extended bearing surface. Obviously, any other suitable bearing may be utilized, as for example a ball bearing inserted into the aperture in the slider plate 40.

The nylon rod 37 is provided with a fine tuning knob 42 which extends through the cabinet and is coupled to the shaft for the rotation of the shaft thereby. The shaft 37 is provided with an enlarged portion 43 at the rear thereof and is held in its rearmost position by means of a spring 44 which extends between a collar 45 formed on the rod 37 and a bushing 46 in the bracket 18. There is in addition formed on the rod or shaft 37 a conical portion 47 which serves as a camming surface and cooperates with a finger 48 supported in any suitable manner from the front plate 38 of the tuner 10. Thus, when the shaft 37 is in its normal rearward position, the finger 48 cooperating with the conical camming surface 47 holds the rod or shaft 37 in its lower position in which the teeth 36 are out of engagement with the pinion 35. Slider 40 is urged to its upward position by means of a spring 50 stretched between a pin 51 bent off from the slider 40 and a projection 52 bent off to the rear from the plate 38.

Also formed integrally with the shaft 37 is a collar 53 which limits the movement of the shaft 37 in the forward and rearward directions since it makes contact with the front surface of the slider 40 when the rod is positioned to the rear and with the rearward edge of finger 48 as the rod is moved forward by means of the knob 42.

It will be seen that as the rod or shaft 37 is moved forwardly the finger 48 permits the spring 50 to elevate the slider 40, thus flexing the nylon rod and permitting the teeth 36 to mesh with the pinion 35. When in this position, adjustment of the slug 32 for the oscillator coil 24 is possible merely by rotating the knob 42 and thus fine tuning adjustment of the coil associated with the particular channel then indicated by the drum 21 may be effected. It will be clear that if inadvertently the rod or shaft 37 is held in its outward (left hand as seen in Fig. 1) position while the main tuning shaft 15 is rotated, no harm will be done other than possibly causing one or more of the tuning slugs to be rotated to an undesired position.

Since each oscillator coil is individually adjusted during the fine tuning operation, the adjustment of the fine tuning of one channel has no effect on any other channel as has hereinabove been explained. This is particularly advantageous when means are provided for remotely rotating the main tuning shaft 11, since only one control has to be provided instead of two, as might otherwise be the case. Of course in some instances the second control is not provided in the remote control unit, but when this is done, as has been the custom in the past, no fine tuning can be effected from the remote location. As pointed out hereinabove, in the present invention no such fine tuning is necessary since the tuning adjustments are individual to the channels.

While we have described a preferred embodiment of our invention, it will be understood that many modifications thereof may be made and we wish, therefore, to be limited not by the foregoing specification, but rather by the claims granted to us.

What is claimed is:

1. In a television receiver having a turret tuning assembly wherein the individual oscillator and radio frequency coils are mounted on wafers of said tuning assembly, the improvement whereby fine tuning of each channel can be permanently achieved from the front panel which comprises mounting said oscillator coils on the periphery of said wafers with their axes parallel to the main tuning shaft, providing each said oscillator coil with a threaded metallic slug having a pinion formed on the end thereof, a nylon shaft arranged for rotation and limited axial movement, means mounting said shaft with one end adjacent and radially outward of said pinions, a knob coupled to one end of said shaft, said end extending through the front panel, teeth cut on the other end of said shaft, means mounted adjacent said toothed shaft end to cause said end to flex sufficiently to engage said teeth with said pinions individually to effect adjustment of said slug and means normally holding said toothed shaft end out of engagement with said pinions.

2. The device of claim 1 in which said means to cause said shaft to flex comprises a slide member containing a bearing surface for said shaft, said slide member being slidably mounted on the front plate of said tuning assembly and spring biased to slide a limited extent to engage said toothed shaft end with said pinions.

3. In a television receiver having a turret tuning assembly wherein the individual oscillator and radio frequency coils are mounted on wafers of said tuning assembly, the improvement whereby fine tuning of each channel can be permanently achieved from the front panel which comprises mounting said oscillator coils on the periphery of said wafers with their axes parallel to the main tuning shaft, providing each said oscillator coil with a threaded metallic slug having a pinion formed on the end thereof and means for rotating said pinion by a knob on the front panel, said means for rotating comprising a nylon shaft arranged for rotation and limited axial movement, a knob coupled to one end of said shaft extending through said front panel, teeth cut on the other end of said shaft, a slide member containing a bearing surface for said shaft, said slide member being slidably mounted on the front plate of said tuning assembly and spring biased to slide through a limited extent by a first biasing spring, an enlarged portion of said shaft, a second biasing spring urging said shaft to its rearmost position, said shaft having formed thereon on its enlarged rear portion a conical camming surface and a collar, said conical camming surface and said collar cooperating with a finger extending from the front plate of said turret tuning assembly to cause said nylon shaft to be flexed downwardly when said shaft is in its rearmost spring biased position, said collar engaging said slide member to limit the rearward motion and engaging said finger when said shaft is in its forward position to limit the forward motion thereof, said conical camming surface permitting said shaft and slide member to move upwardly, under the influence of said first biasing spring, thus flexing said shaft to cause said teeth to engage with said pinion whereby by rotating said knob said slug is caused to vary its penetration into the center of said coil, thereby varying the inductance of said coil.

References Cited in the file of this patent

FOREIGN PATENTS 684,041 Great Britain ———— Dec. 10, 1952